(12) United States Patent
You et al.

(10) Patent No.: US 9,698,206 B2
(45) Date of Patent: Jul. 4, 2017

(54) ORGANIC LIGHT-EMITTING DISPLAY APPARATUS

(71) Applicant: SAMSUNG DISPLAY CO., LTD., Yongin-si, Gyeonggi-do (KR)

(72) Inventors: Chungi You, Yongin-si (KR); Daewoo Kim, Yongin-si (KR); Jonghyun Park, Yongin-si (KR); Gwanggeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/858,742

(22) Filed: Sep. 18, 2015

(65) Prior Publication Data

US 2016/0104858 A1  Apr. 14, 2016

(30) Foreign Application Priority Data

Oct. 14, 2014 (KR) ........................ 10-2014-0138614

(51) Int. Cl.
*H01L 27/32* (2006.01)

(52) U.S. Cl.
CPC ........ *H01L 27/3258* (2013.01); *H01L 27/326* (2013.01); *H01L 27/3262* (2013.01)

(58) Field of Classification Search
CPC . H01L 27/32; H01L 27/1255; H01L 27/1288; H01L 27/3258; H01L 27/3262
See application file for complete search history.

(56) References Cited

U.S. PATENT DOCUMENTS

| 6,582,875 | B1 | 6/2003 | Kay et al. |
| 9,336,739 | B2 * | 5/2016 | Yamazaki ............ G09G 3/3677 |
| 2005/0285509 | A1 * | 12/2005 | Funamoto ........... H01L 51/5209 |
| | | | 313/504 |
| 2007/0128765 | A1 | 6/2007 | Auch et al. |
| 2011/0175081 | A1 * | 7/2011 | Goyal ................ H01L 29/7869 |
| | | | 257/43 |
| 2013/0001564 | A1 * | 1/2013 | Choi ................... H01L 27/3276 |
| | | | 257/59 |

(Continued)

FOREIGN PATENT DOCUMENTS

| KR | 10-2009-0120698 A | 11/2009 |
| KR | 10-2013-0080642 A | 7/2013 |
| KR | 10-2014-0032267 A | 3/2014 |

*Primary Examiner* — Phuc Dang
(74) *Attorney, Agent, or Firm* — Lewis Roca Rothgerber Christie LLP

(57) ABSTRACT

An OLED apparatus includes: a substrate; a TFT on the substrate and comprising an active layer, a first interlayer insulating layer between the gate electrode and the source and drain electrodes and comprising an inorganic material; a second interlayer insulating layer between the first interlayer insulating layer and the source and drain electrodes and comprising an organic material; a first organic layer covering the source and drain electrodes; a second organic layer on the first organic layer; a capacitor comprising a first electrode comprising a same material as the gate electrode, and a second electrode comprising a same material as the source and drain electrodes; a pixel electrode in an opening in an area that does not overlap with the TFT and the capacitor, and contacting one of the source and drain electrodes; an emission layer on the pixel electrode; and an opposite electrode on the emission layer.

20 Claims, 8 Drawing Sheets

(56) References Cited

U.S. PATENT DOCUMENTS

| | | | |
|---|---|---|---|
| 2013/0119388 A1* | 5/2013 | Lee | H01L 51/5265 257/59 |
| 2013/0161631 A1* | 6/2013 | Lee | H01L 29/66765 257/71 |
| 2013/0175533 A1 | 7/2013 | Lee et al. | |
| 2013/0196565 A1* | 8/2013 | Miyake | G02F 1/1337 445/25 |
| 2013/0200379 A1* | 8/2013 | You | H01L 29/4908 257/59 |
| 2014/0042397 A1* | 2/2014 | Cho | H01L 51/0001 257/40 |
| 2014/0061607 A1 | 3/2014 | You et al. | |
| 2014/0353622 A1* | 12/2014 | You | H01L 27/3248 257/40 |
| 2015/0034933 A1* | 2/2015 | Hong | H01L 29/66969 257/40 |
| 2015/0060869 A1* | 3/2015 | Ro | H01L 27/1266 257/72 |

* cited by examiner

ORGANIC LIGHT-EMITTING DISPLAY APPARATUS

CROSS-REFERENCE TO RELATED APPLICATION

This application claims priority to and the benefit of Korean Patent Application No. 10-2014-0138614, filed on Oct. 14, 2014, in the Korean Intellectual Property Office, the disclosure of which is incorporated herein in its entirety by reference.

BACKGROUND

1. Field

One or more example embodiments relate to an organic light-emitting display apparatus.

2. Description of the Related Art

An organic light-emitting display apparatus is a self-emissive display apparatus including a hole injection electrode and an electron injection electrode, and an emission layer formed therebetween, in which holes injected from the hole injection electrode and electrons injected from the electron injection electrode are re-combined in the emission layer so that light is emitted therefrom. The organic light-emitting display apparatus is expected to become a next generation display apparatus due to its high quality characteristics such as low power consumption, high contrast, fast response time, etc.

SUMMARY

One or more example embodiments include an organic light-emitting display apparatus having an improved display quality.

Additional aspects will be set forth in part in the description which follows and, in part, will be apparent from the description, or may be learned by practice of the presented embodiments.

According to some embodiments of the present invention, an organic light-emitting display apparatus includes: a substrate; a thin-film transistor (TFT) on the substrate and comprising an active layer, a gate electrode, a source electrode, and a drain electrode; a first interlayer insulating layer between the gate electrode and the source and drain electrodes and comprising an inorganic material; a second interlayer insulating layer between the first interlayer insulating layer and the source and drain electrodes and comprising an organic material; a first organic layer covering the source electrode and the drain electrode; a second organic layer on the first organic layer; a capacitor comprising a first electrode comprising a same material as the gate electrode, and a second electrode comprising a same material as the source electrode and the drain electrode; a pixel electrode in an opening in an area that does not overlap with the TFT and the capacitor, and contacting one of the source electrode and the drain electrode; an emission layer on the pixel electrode; and an opposite electrode on the emission layer.

The pixel electrode may be a translucent electrode, and the opposite electrode may be a reflective electrode.

The pixel electrode may include a first transparent conductive oxide layer, a translucent metal layer, and a second transparent conductive oxide layer.

An end of the pixel electrode may be on the first organic layer and may be covered with the second organic layer.

The opening in which the pixel electrode is arranged may expose the second interlayer insulating layer, the first organic layer, and the second organic layer in an overlapping manner.

A width of an opening in the first organic layer may be greater than a width of an opening in the second organic layer and may be smaller than a width of an opening in the second interlayer insulating layer.

The opening in which the pixel electrode is arranged may further expose the first interlayer insulating layer in an overlapping manner.

A width of an opening in the first organic layer may be greater than a width of an opening in the second organic layer and may be smaller than a width of an opening in the interlayer insulating layer and the second interlayer insulating layer.

A bottom surface of the pixel electrode may contact a top surface of the first interlayer insulating layer.

A thickness of the gate electrode may be between about 6,000 and about 12,000 Å.

The second electrode of the capacitor may be arranged in an opening that is in the second interlayer insulating layer.

A bottom surface of the second electrode of the capacitor may contact a top surface of the first interlayer insulating layer.

Each of the source electrode and the drain electrode may include a first metal layer and a second metal layer on the first metal layer.

The organic light-emitting display apparatus may further include a protective layer on the source electrode and the drain electrode.

The organic light-emitting display apparatus may further include a pad electrode on a same layer as the source electrode and the drain electrode.

The pad electrode may include a first pad layer and a second pad layer on the first pad layer.

The organic light-emitting display apparatus may further include a protective layer on the pad electrode.

The organic light-emitting display apparatus may further include a cathode contact layer on the second interlayer insulating layer and contacting the opposite electrode via contact holes in the first organic layer and the second organic layer.

The cathode contact layer may include a same material as the source electrode and the drain electrode.

The organic light-emitting display apparatus may further include a protective layer on the cathode contact layer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
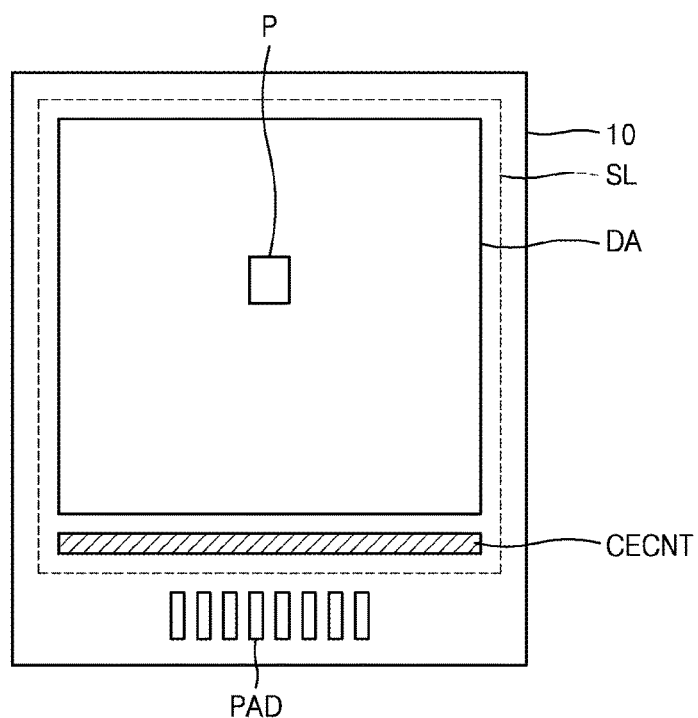
FIG. 1 is a plan view of an organic light-emitting display apparatus according to some embodiments of the present invention.

As the embodiments of the present invention allow for various changes and numerous embodiments, particular embodiments will be illustrated in the drawings and described in detail in the written description. Aspects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein.

Hereinafter, one or more example embodiments will be described below in more detail with reference to the accompanying drawings. Those components that are the same or are in correspondence are rendered the same reference numeral regardless of the figure number, and redundant explanations are omitted.

Hereinafter, in one or more example embodiments, while such terms as "first," "second," etc., may be used, but such components must not be limited to the above terms, and the above terms are used only to distinguish one component from another.

Hereinafter, in one or more example embodiments, a singular form may include plural forms, unless there is a particular description contrary thereto.

Hereinafter, in one or more example embodiments, terms such as "comprise" or "comprising" are used to specify existence of a recited feature or component, not excluding the existence of one or more other recited features or one or more other components.

Hereinafter, in one or more example embodiments, it will also be understood that when an element such as layer, region, or component is referred to as being "on" another element, it can be directly on the other element, or intervening elements such as layer, region, or component may also be interposed therebetween.

In the drawings, for convenience of description, the sizes of layers and regions are exaggerated for clarity. For example, a size and thickness of each element may be random for convenience of description, thus, one or more example embodiments are not limited thereto.

As used herein, the term "and/or" includes any and all combinations of one or more of the associated listed items.

Figure 2:
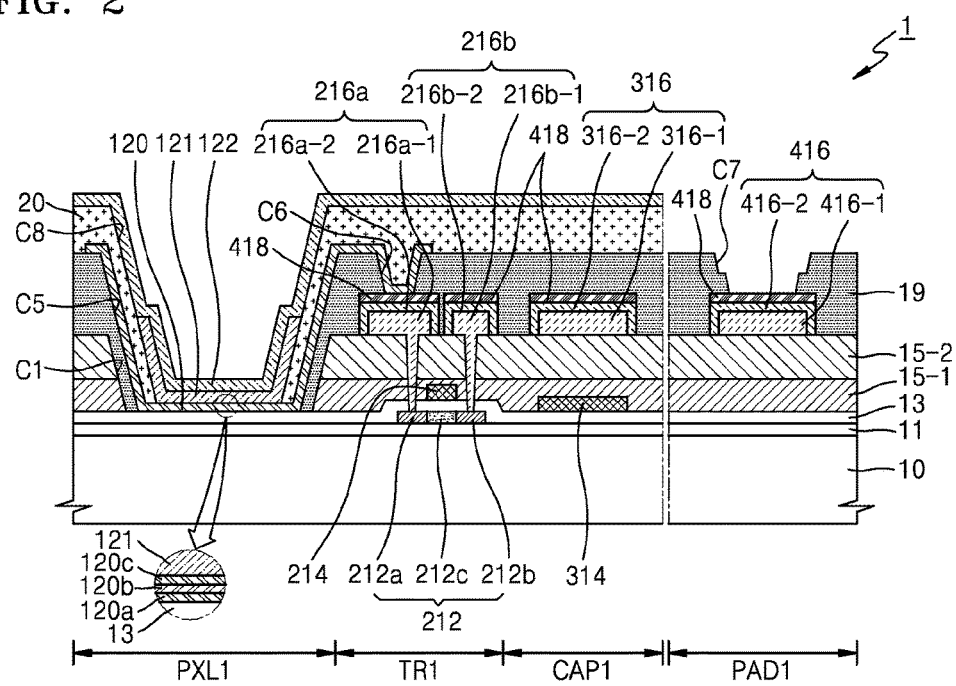
FIG. 2 is a cross-sectional view illustrating a portion of an emission pixel and a portion of a pad of the organic light-emitting display apparatus according to some embodiments of the present invention.

FIG. 1 is a plan view of an organic light-emitting display apparatus 1 according to a first example embodiment. FIG. 2 is a cross-sectional view illustrating a portion of an emission pixel and a portion of a pad of the organic light-emitting display apparatus 1 according to the first example embodiment.

Referring to FIG. 1, the organic light-emitting display apparatus 1 includes a display area DA on a substrate 10, and the display area DA includes a plurality of pixels P and thus displays an image. The display area DA is formed within a sealing line SL, and an encapsulation member (not shown) is arranged to encapsulate the display area DA along the sealing line SL. A cathode contact part CECNT is formed between the display area DA and a pad PAD so as to supply power to a cathode that is commonly formed in the display area DA.

Referring to FIG. 2, a pixel region PXL1 having at least one emission layer 121, a thin-film transistor region TR1 having at least one thin-film transistor, a capacitor region CAP1 having at least one capacitor, and a pad region PAD1 are arranged on the substrate 10.

In the thin-film transistor region TR1, an active layer 212 of the thin-film transistor is arranged above the substrate 10 and a buffer layer 11.

The substrate 10 may be formed as a transparent substrate including a glass substrate or a plastic substrate including polyethylen terephthalate (PET), polyethylen naphthalate (PEN), polyimide, or the like.

The buffer layer 11 may be further arranged on the substrate 10 so as to form a planar surface on the substrate 10 and to prevent penetration of foreign substances or contaminants. The buffer layer 11 may be formed as a single layer or multiple layers including silicon nitride and/or silicon oxide.

The active layer 212 is arranged on the buffer layer 11 in the thin-film transistor region TR1. The active layer 212 may be formed of a semiconductor including amorphous silicon or polysilicon. The active layer 212 may include a channel region 212c, and a source region 212a and a drain region 212b that are arranged at both sides of the channel region 212c and are doped with impurity. A material of the active layer 212 is not limited to amorphous silicon or poly silicon and may include an oxide semiconductor.

A gate insulating layer 13 is arranged on the active layer 212. The gate insulating layer 13 may be formed as a single layer or multiple layers including silicon nitride and/or silicon oxide.

A gate electrode 214 is arranged on the gate insulating layer 13. The gate electrode 214 may be formed as a single layer or multiple layers including at least one metal material selected from (e.g., selected from the group consisting of) aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

Although not illustrated in FIG. 2, a wiring such as a scan line may be formed on a same layer as the gate electrode 214 by using a same material as the gate electrode 214. As a size of a screen of the organic light-emitting display apparatus 1 is increased, a thickness of the wiring may be increased so as to prevent or reduce a signal delay due to the large screen. In the present embodiment, a thickness of the gate electrode 214 and the wiring may be set between about 6,000 and about 12,000 Å. When the thickness of the gate electrode 214 and the wiring is equal to or greater than at least 6,000 Å, the signal delay may be prevented or reduced in a large screen of at least 50 inches. In this regard, it is difficult to form via deposition the thickness of the gate electrode 214 and the wiring to be greater than 12,000 Å.

A first interlayer insulating layer 15-1 and a second interlayer insulating layer 15-2 are deposited on the gate electrode 214. The first interlayer insulating layer 15-1 may be formed as an inorganic insulating layer, and the second interlayer insulating layer 15-2 may be formed as an organic insulating layer. In order to prevent or reduce the signal delay in the organic light-emitting display apparatus 1 with a large screen, the gate electrode 214 and the wiring may be formed to be relatively thick, and if only the inorganic insulating layer such as the first interlayer insulating layer 15-1 is formed, a crack may occur in the inorganic insulating layer due to the thickness of the wiring. Also, if only the first interlayer insulating layer 15-1 is formed, parasitic capacitance between a wiring formed below the first interlayer insulating layer 15-1 and a wiring formed on the first interlayer insulating layer 15-1 may be increased such that a capacitive coupling may occur and thus may prevent or reduce exact signal transmission.

However, in the organic light-emitting display apparatus 1 according to the present embodiment, even when the gate electrode 214 and the wiring are relatively thick, because the second interlayer insulating layer 15-2 that is an organic layer is further formed, incidences of cracking in the first interlayer insulating layer 15-1 may be prevented or reduced, and the parasitic capacitance between the wirings below and on the first interlayer insulating layer 15-1 may be decreased so that the exact or more accurate signal transmission may be maintained.

A source electrode 216a and a drain electrode 216b are arranged on the second interlayer insulating layer 15-2. The source electrode 216a and the drain electrode 216b may be at least two different metal layers having different electron mobilities. For example, the source electrode 216a and the drain electrode 216b may be formed as at least two different metal layers including metal materials selected from Al, Pt, Pd, Ag, Mg, Au, Ni, Nd, Ir, Cr, Li, Ca, Mo, Ti, W, Cu, and an alloy thereof.

Each of the source electrode 216a and the drain electrode 216b may be formed as double metal layers. For example, the source electrode 216a may be formed as a first layer 216a-1 of a source electrode and a second layer 216a-2 that covers the first layer 216a-1. Also, the drain electrode 216b may be formed as a first layer 216b-1 of a drain electrode and a second layer 216b-2 that covers the first layer 216b-1. Each of the first and second layers 216a-1, 216a-2, 216b-1, and 216b-2 that are metal layers may be formed as at least double different metal layers including metal materials selected from Al, Pt, Pd, Ag, Mg, Au, Ni, Nd, Ir, Cr, Li, Ca, Mo, Ti, W, Cu, and an alloy thereof. In this manner, because each of the source electrode 216a and the drain electrode 216b is formed as double metal layers, a thickness of the source electrode 216a and the drain electrode 216b may be increased. By doing so, resistance at the wiring may be reduced, so that the signal delay due to the resistance at the wiring may be decreased.

A protective layer 418 is formed on the second layer 216a-2 of the source electrode 216a and the second layer 216b-2 of the drain electrode 216b. Because the protective layer 418 is arranged on the second layer 216a-2 and the second layer 216b-2, the protective layer 418 may prevent or reduce exposure to the source electrode 216a and the drain electrode 216b of an etchant while a pixel electrode 120 is etched, so that particle defects may be prevented or reduced.

Because the protective layer 418 and the second layer 216a-2 of the source electrode 216a, and the protective layer 418 and the second layer 216b-2 of the drain electrode 216b are etched by using a same mask, etched surfaces of ends of the protective layer 418, the second layer 216a-2 of the source electrode 216a, and the second layer 216b-2 of the drain electrode 216b may be equal to with each other.

A first organic layer 19 that covers the source electrode 216a and the drain electrode 216b is arranged on the source electrode 216a and the drain electrode 216b. A second organic layer 20 is arranged on the first organic layer 19. The first organic layer 19 and the second organic layer 20 may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof.

The pixel electrode 120 contacts one of the source electrode 216a and the drain electrode 216b via a contact hole C6 formed in the first organic layer 19.

The pixel electrode 120 is arranged above the buffer layer 11 and the gate insulating layer 13 in the pixel region PXL1. The pixel electrode 120 is arranged in an opening formed in a region that does not overlap with the thin-film transistor or a capacitor to be described in further detail below.

A width of an opening C5 formed in the first organic layer 19 is greater than a width of an opening C8 formed in the second organic layer 20 and is smaller than a width of an opening C1 formed in the first interlayer insulating layer 15-1 and the second interlayer insulating layer 15-2. The opening C8 formed in the second organic layer 20, the opening C5 formed in the first organic layer 19, and the opening C1 formed in the first interlayer insulating layer 15-1 and the second interlayer insulating layer 15-2 overlap with each other.

An end of the pixel electrode 120 is positioned on the opening C5 formed in the first organic layer 19 and is covered with the second organic layer 20.

The pixel electrode 120 includes a translucent metal layer 120b. Also, the pixel electrode 120 may further include layers 120a and 120c that include transparent conductive oxide and are respectively formed below and on the translucent metal layer 120b so as to protect the translucent metal layer 120b.

The translucent metal layer 120b may be formed of Ag or a silver alloy. The translucent metal layer 120b and an opposite electrode 122 that is a reflective electrode to be described later may form a micro-cavity structure and thus may improve a luminescent efficiency of the organic light-emitting display apparatus 1.

The layers 120a and 120c that include the transparent conductive oxide may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The transparent conductive oxide layer 120a below the translucent metal layer 120b may reinforce adhesion between the gate insulating layer 13 and the pixel electrode 120, and the transparent conductive oxide layer 120c on the translucent metal layer 120b may function as a barrier layer for protecting the translucent metal layer 120b.

A metal material such as silver that is highly reducible may cause a problem by which a silver particle is extracted while the pixel electrode 120 is etched. The extracted silver particle may be a factor of a particle defect that causes a dark spot. While the pixel electrode 120 including silver is etched, if the source electrode 216a, the drain electrode 216b, a pad electrode 416, or the wiring is exposed to an etchant, silver ion that is highly reducible may receive an electron from the aforementioned metal materials and may be re-extracted as a silver particle. However, in the organic light-emitting display apparatus 1 according to the present embodiment, the source electrode 216a, the drain electrode 216b, and the pad electrode 416 are protected by the protective layer 418 and thus are not exposed to the etchant. Therefore, the particle defect due to the re-extraction of the silver particle may be prevented or reduced.

An intermediate layer including the emission layer 121 is arranged on the pixel electrode 120 whose top surface is exposed by the opening C8 formed in the second organic layer 20. The emission layer 121 may include a small molecule organic material or a polymer organic material.

If the emission layer 121 includes the small molecule organic material, the intermediate layer may further include a hole transport layer (HTL), a hole injection layer (HIL), an electron transport layer (ETL), or an electron injection layer (EIL). In addition to these layers, if required, the intermediate layer may further include various layers. Here, various organic materials including copper phthalocyanine (CuPc), N,N'-Di(naphthalene-1-yl)-N,N'-diphenyl-benzidine (NPB), tris-8-hydroxyquinoline aluminum)(Alq3), or the like may be used.

If the emission layer 121 includes the polymer organic material, the intermediate layer may further include an HTL. The HTL may be formed of poly-(2,4)-ethylene-dihydroxy thiophene (PEDOT) or polyaniline (PANI). Here, the polymer organic material may include poly-phenylenevinylene (PPV), polyfluorene, or the like. Also, an inorganic material may be further arranged between the emission layer 121 and pixel electrode 120 and may be further arranged between the emission layer 121 and the opposite electrode 122.

Referring to FIG. 2, the emission layer 121 is positioned in the opening C8 but this is only for convenience of description and one or more example embodiments are not limited thereto. The emission layer 121 may be formed not only in the opening C8 but may also extend to a top surface of the second organic layer 20 along an etched surface of the opening C5 formed in the first organic layer 19.

The opposite electrode 122 that is commonly formed in pixels is arranged on the emission layer 121. In the organic light-emitting display apparatus 1 according to the present embodiment, the pixel electrode 120 is used as an anode and the opposite electrode 122 is used as a cathode but polarities of electrodes may be switched.

The opposite electrode 122 may be the reflective electrode including a reflective material. The opposite electrode 122 may include at least one material selected from Al, Mg, Li, Ca, LiF/Ca, and LiF/Al. Because the opposite electrode 122 is formed as the reflective electrode, light that is emitted from the emission layer 121 is reflected from the opposite electrode 122 and thus is discharged toward the substrate 10 via the pixel electrode 120 formed of translucent metal.

The capacitor region CAP1 has a capacitor including a first electrode 314 arranged on a same layer as the gate electrode 214, and a second electrode 316 arranged on a same layer as the source electrode 216a and the drain electrode 216b. The first interlayer insulating layer 15-1 and the second interlayer insulating layer 15-2 are arranged between the first electrode 314 and the second electrode 316.

The first electrode 314 may be formed of a same material as the gate electrode 214. The second electrode 316 may be formed as double metal layers. That is, the second electrode 316 may include a first layer 316-1 and a second layer 316-2.

The protective layer 418 is formed on the second layer 316-2 of the second electrode 316. The protective layer 418 may prevent the second electrode 316 of the capacitor from being exposed to an etchant while the pixel electrode 120 is etched, so that instances of a particle defect may be prevented or reduced.

Because the protective layer 418 and the second layer 316-2 of the second electrode 316 are etched by using a same mask, etched surfaces of ends of the protective layer 418 and the second layer 316-2 of the second electrode 316 may be equal to with each other.

In the pad region PAD1 that is an outer region of the display area DA, the pad electrode 416 that is a connection terminal of an external driver is positioned.

The pad electrode 416 is arranged on the second interlayer insulating layer 15-2, and ends of the pad electrode 416 are covered with the first organic layer 19.

The pad electrode 416 is formed of a same material as the source electrode 216a and the drain electrode 216b. The pad electrode 416 may be formed as double metal layers, e.g., the pad electrode 416 may include a first pad layer 416-1 and a second pad layer 416-2.

The protective layer 418 is formed on the second pad layer 416-2. The protective layer 418 prevents the pad electrode 416 from being exposed to an etchant while the pixel electrode 120 is etched, so that instances of a particle defect may be prevented or reduced. Also, the protective layer 418 prevents the pad electrode 416 from being exposed to moisture and oxygen, so that it is possible to prevent reliability of a pad from deteriorating.

Because the protective layer 418 and the second pad layer 416-2 are etched by using a same mask, etched surfaces of ends of the protective layer 418 and the second pad layer 416-2 may be equal to each other.

The opposite electrode 122 is not separately formed in each pixel but is formed as a common electrode that wholly covers the display area DA (refer to FIG. 1), and the cathode contact part CECNT is formed at an outer side of the display area DA and supplies a signal to the common electrode.

Referring to FIG. 1, the cathode contact part CECNT is positioned between the display area DA and the pad PAD but one or more example embodiments are not limited thereto. The cathode contact part CECNT may be positioned anywhere between the display area DA and the sealing line SL.

Figure 4:
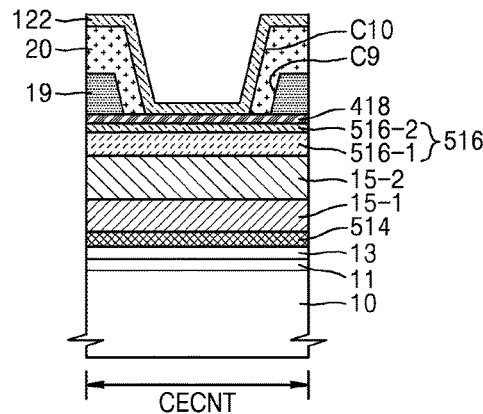
FIG. 4 is a cross-sectional view illustrating a portion of a cathode contact part of the organic light-emitting display apparatus according to some embodiments of the present invention.

FIG. 4 is a cross-sectional view illustrating a portion of the cathode contact part CECNT of the organic light-emitting display apparatus 1 according to the first example embodiment.

A wiring 514 is positioned above the substrate 10, the buffer layer 11, and the gate insulating layer 13. The wiring 514 may be a signal wiring that is coupled to a scan line.

The first interlayer insulating layer 15-1 and the second interlayer insulating layer 15-2 are arranged on the wiring 514, and a cathode contact layer 516 is arranged on the second interlayer insulating layer 15-2.

The cathode contact layer 516 may be formed of a same material as the source electrode 216a and the drain electrode 216b. The cathode contact layer 516 may be formed as double metal layers. That is, the cathode contact layer 516 may include a first layer 516-1 and a second layer 516-2.

The protective layer 418 is formed on the second layer 516-2. The protective layer 418 prevents the cathode contact layer 516 from being exposed to an etchant while the pixel electrode 120 is etched, so that instances of a particle defect may be prevented or reduced.

The opposite electrode 122 is electrically coupled to the cathode contact layer 516 via a contact hole C9 formed in the first organic layer 19 and a contact hole C10 formed in the second organic layer 20. Because a size of the screen of the organic light-emitting display apparatus 1 is increased, heat emission due to electrode power supply may be reduced by enlarging an area of the cathode contact part CECNT. If the area of the cathode contact part CECNT is enlarged, the area partly overlaps with the wiring 514 that is arranged below the cathode contact layer 516. If a thickness of the wiring 514 is great, a short may occur at the wiring 514 and the cathode contact layer 516 in the overlapped area. However, in the present embodiment, the first interlayer insulating layer 15-1 that is the inorganic layer and the second interlayer insulating layer 15-2 that is the organic layer are arranged between the wiring 514 and the cathode contact layer 516, so that a short between the wiring 514 and the cathode contact layer 516 may be prevented.

The organic light-emitting display apparatus 1 may further include an encapsulation member that encapsulates the pixel region PXL1, the capacitor region CAP1, and the thin-film transistor region TR1. The encapsulation member may be formed as a substrate including a glass material, a metal film, or an encapsulation thin film formed of an organic insulating film and an inorganic insulating film that are alternately stacked.

Hereinafter, a method of manufacturing the organic light-emitting display apparatus 1 will be described with reference to FIGS. 3A through 3I.

Figure 3A:
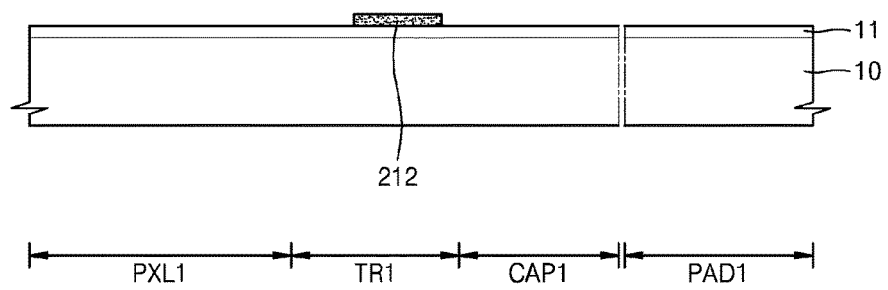
FIGS. 3A through 3I are cross-sectional views illustrating a method of manufacturing the organic light-emitting display apparatus according to some embodiments of the present invention.

FIG. 3A is a cross-sectional view illustrating a first process for the organic light-emitting display apparatus 1, according to an example embodiment.

Referring to FIG. 3A, the buffer layer 11 is formed on the substrate 10, and a semiconductor layer is formed on the buffer layer 11 and then is patterned so as to form the active layer 212 of a thin-film transistor.

After photoresist is coated on the semiconductor layer, the semiconductor layer is patterned via a photolithography process using a first photomask, so that the active layer 212 is formed. The photolithography process is processed in a manner that the first photomask is exposed by an exposure device, and then developing, etching, and stripping or ashing processes are sequentially performed.

The semiconductor layer may be formed of amorphous silicon or poly silicon. Here, the poly silicon may be formed by crystallizing the amorphous silicon. The crystallization of the amorphous silicon may be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a method for the semiconductor layer is not limited to the amorphous silicon or the poly silicon and may include an oxide semiconductor.

Figure 3B:
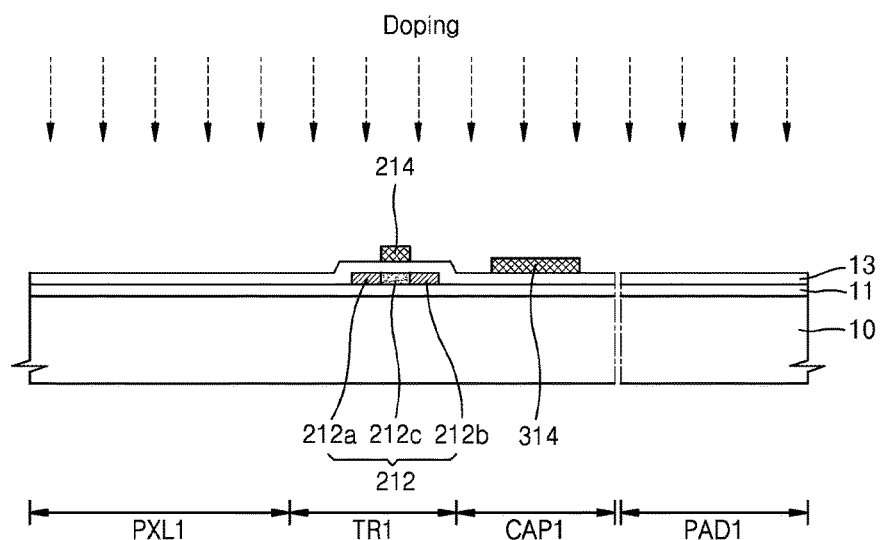

FIG. 3B is a cross-sectional view illustrating a second process for the organic light-emitting display apparatus 1, according to an example embodiment.

The gate insulating layer 13 is formed on the resultant of the first process shown in FIG. 3A, and a first metal layer is formed on the gate insulating layer 13 and is patterned. After the first metal layer is stacked and is patterned. The first metal layer may be formed as a single layer or multiple layers including at least one metal material selected from Al, Pt, Pd, Ag, Mg, Au, Ni, Nd, Ir, Cr, Li, Ca, Mo, Ti, W, and Cu.

As a patterning result, the gate electrode 214 and the first electrode 314 of the capacitor are formed on the gate insulating layer 13.

Ion impurity is doped on the aforementioned structure. The ion impurity including b-type ion or p-type ion may be doped, and in more detail, the ion impurity with a density of at least $1 \times 10^{15}$ atoms/cm$^2$ is doped while targeting the active layer 212 of the thin-film transistor.

The active layer 212 is doped with the ion impurity by using the gate electrode 214 as a self-align mask, so that the active layer 212 has the source region 212a and the drain region 212b, and the channel region 212c therebetween.

Figure 3C:
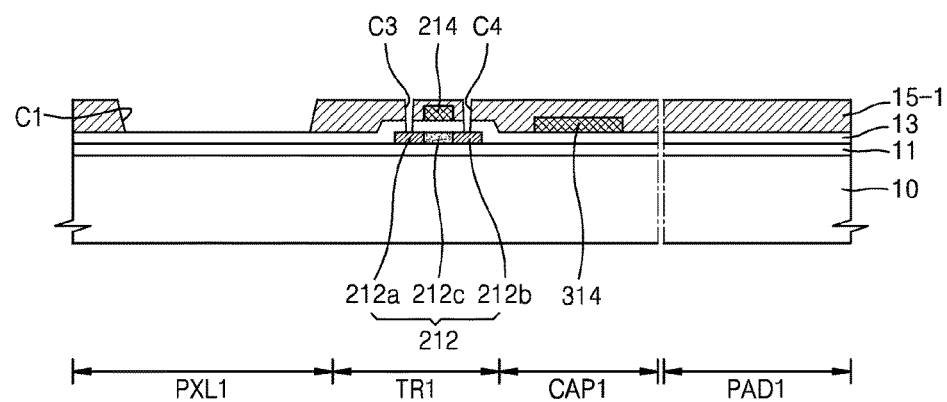

FIG. 3C is a cross-sectional view illustrating a third process for the organic light-emitting display apparatus 1, according to an example embodiment.

The first interlayer insulating layer 15-1 is formed on the resultant of the second process shown in FIG. 3B and is patterned so as to form the opening C3 and C4 for exposing the source region 212a and the drain region 212b of the active layer 212 and to form the opening C1 at a region in which the pixel electrode 120 is to be arranged and that is separate from the active layer 212 in a side direction.

Figure 3D:
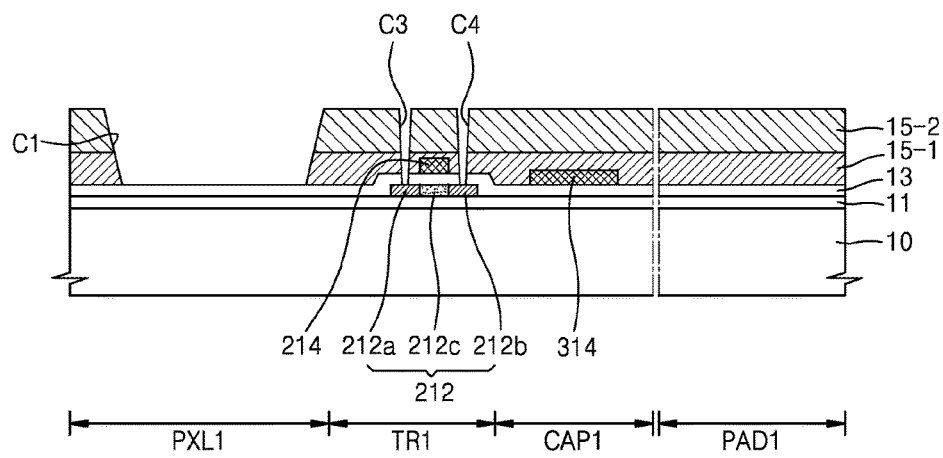

FIG. 3D is a cross-sectional view illustrating a fourth process for the organic light-emitting display apparatus 1, according to an example embodiment.

The second interlayer insulating layer 15-2 is formed on the resultant of the third process shown in FIG. 3C, and the openings C1, C3, and C4 that are formed in the previous process are extended.

Figure 3E:
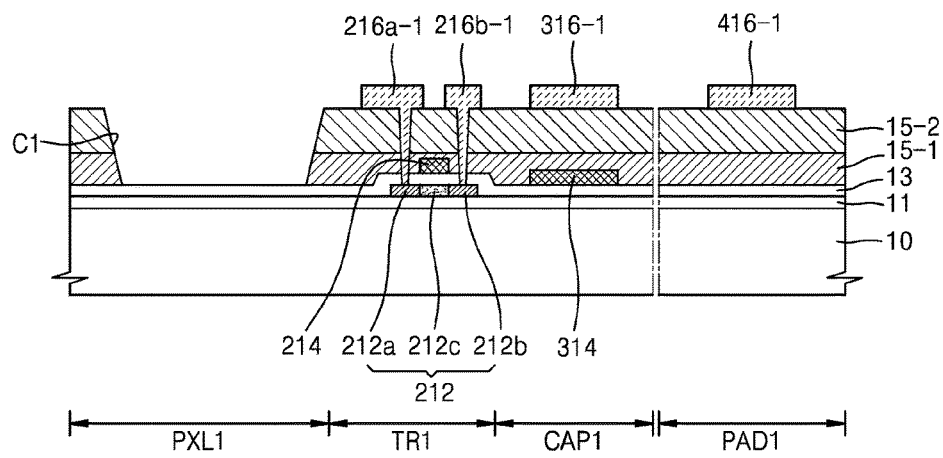

FIG. 3E is a cross-sectional view illustrating a fifth process for the organic light-emitting display apparatus 1, according to an example embodiment.

Referring to FIG. 3E, a second metal layer is formed on the resultant of the fourth process shown in FIG. 3D and is patterned, so that the first layer 216a-1 of the source electrode 216a, the first layer 216b-1 of the drain electrode 216b, the first layer 316-1 of the second electrode 316 of the capacitor, and the first pad layer 416-1 of the pad electrode 416 are simultaneously formed.

The second metal layer may be at least two different metal layers having different electron mobilities. For example, the second metal layer may be formed as at least two different metal layers including metal materials selected from Al, Pt, Pd, Ag, Mg, Au, Ni, Nd, Ir, Cr, Li, Ca, Mo, Ti, W, Cu, and an alloy thereof.

Figure 3F:
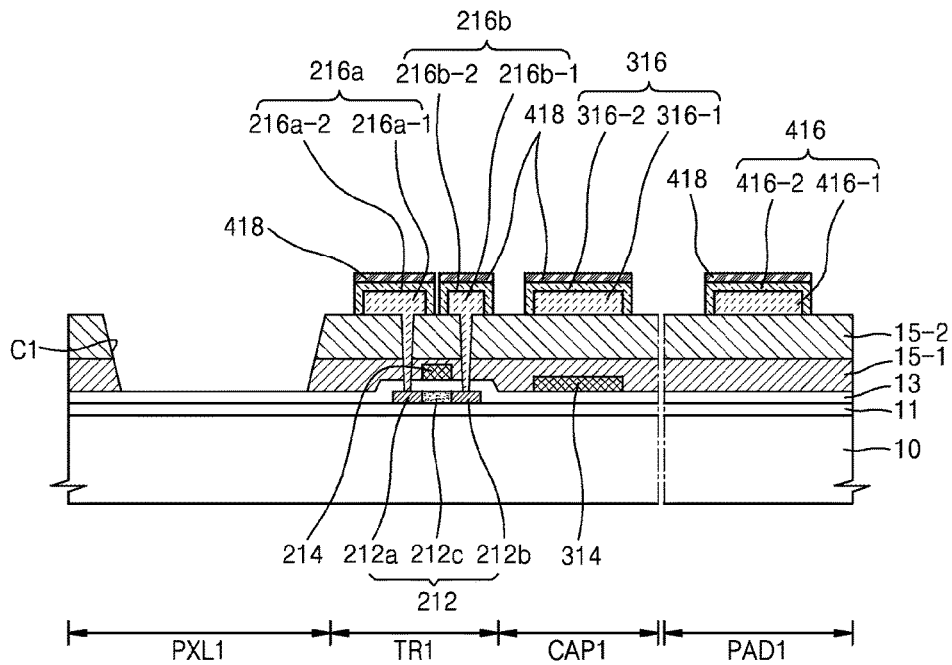

FIG. 3F is a cross-sectional view illustrating a sixth process for the organic light-emitting display apparatus 1, according to an example embodiment.

Referring to FIG. 3F, a third metal layer and a transparent conductive oxide layer are sequentially deposited and are patterned on the resultant of the fifth process shown in FIG. 3E, so that the second layer 216a-2 of the source electrode 216a, the second layer 216b-2 of the drain electrode 216b, the second layer 316-2 of the second electrode 316 of the capacitor, and the second pad layer 416-2 of the pad electrode 416 are concurrently (e.g., simultaneously) formed. Here, the protective layer 418 that is formed by patterning transparent conductive oxide is commonly formed on the second layer 216a-2 of the source electrode 216a, the second layer 216b-2 of the drain electrode 216b, the second layer 316-2 of the second electrode 316 of the capacitor, and the second pad layer 416-2 of the pad electrode 416.

Because the third metal layer and the transparent conductive oxide layer are concurrently (e.g., simultaneously) patterned, etched surfaces of ends of the second layer 216a-2 of the source electrode 216a, the second layer 216b-2 of the drain electrode 216b, the second layer 316-2 of the second electrode 316 of the capacitor, the second pad layer 416-2 of the pad electrode 416, and the protective layer 418 formed thereon are equal to each other.

Figure 3G:
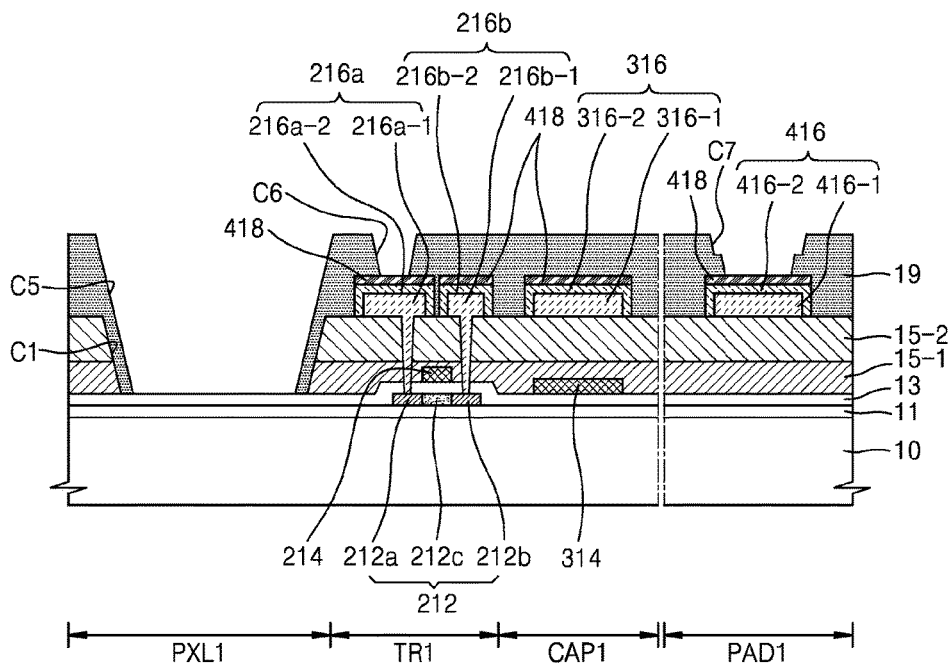

FIG. 3G is a cross-sectional view illustrating a seventh process for the organic light-emitting display apparatus 1, according to an example embodiment.

Referring to FIG. 3G, the first organic layer 19 is formed on the resultant of the sixth process shown in FIG. 3F and is patterned, so that the contact hole C6 and the contact hole C7 for exposing a top surface of the protective layer 418 of the pad electrode 416 are formed, and the opening C5 is formed in the pixel region PXL1 in which the pixel electrode 120 is to be arranged.

The first organic layer 19 is formed to completely cover the source electrode 216a and the drain electrode 216b and thus, when the pixel electrode 120 is etched, the first organic layer 19 prevents different-type wirings having an electrical potential difference from being exposed to an etchant including silver ion or other contaminants.

Figure 3H:
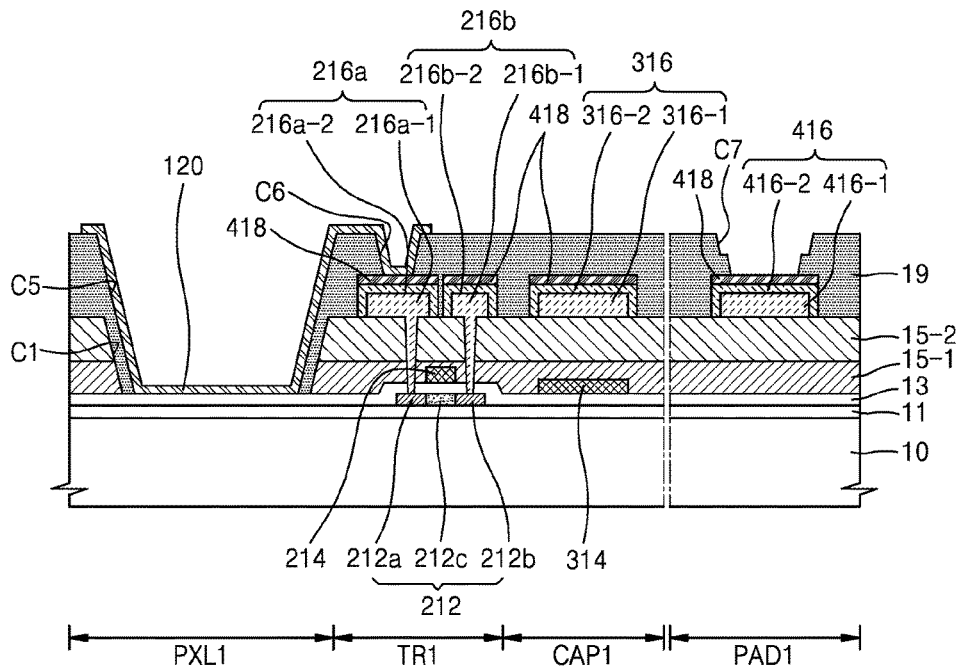

FIG. 3H is a cross-sectional view illustrating an eighth process for the organic light-emitting display apparatus 1, according to an example embodiment.

Referring to FIG. 3H, a translucent metal layer is formed on the resultant of the seventh process shown in FIG. 3G and is patterned, so that the pixel electrode 120 is formed.

Figure 3I:
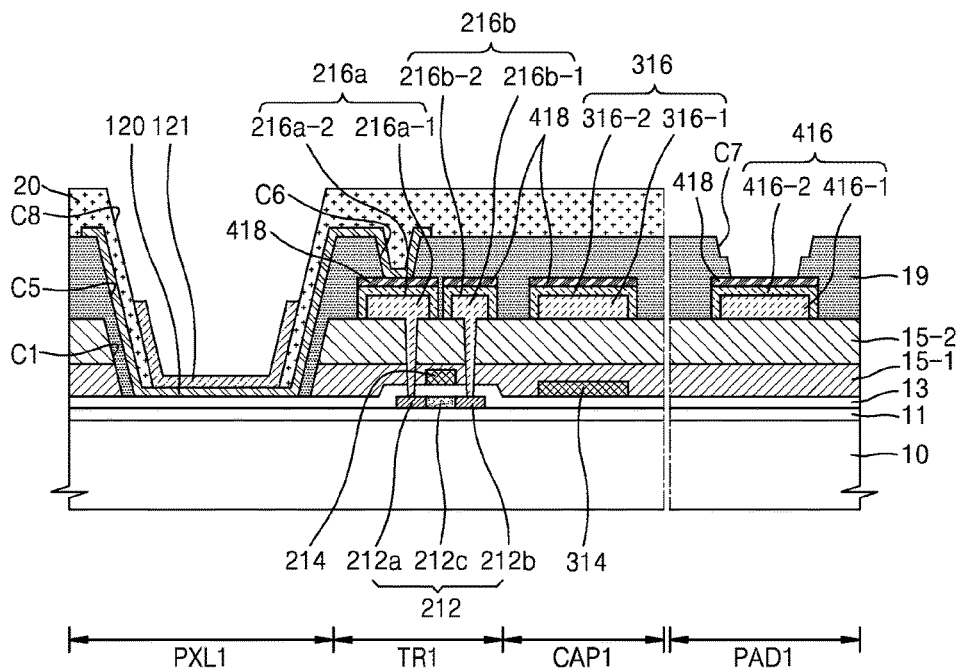

FIG. 3I is a cross-sectional view illustrating a ninth process for the organic light-emitting display apparatus 1, according to an example embodiment.

Referring to FIG. 3I, after the second organic layer 20 is formed on the resultant of the eighth process shown in FIG. 3H, the ninth process of forming the opening C8 is performed so as to expose a top surface of the pixel electrode 120.

The second organic layer 20 functions as a pixel defining layer and may be formed as an organic insulating layer including polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof.

The intermediate layer including the emission layer 121 (refer to FIG. 2) is formed on the resultant of the ninth process shown in FIG. 3I, and the opposite electrode 122 (refer to FIG. 2) is formed.

In the organic light-emitting display apparatus 1 according to the first example embodiment, the pixel electrode 120 includes the translucent metal layer 120b, so that a luminescent efficiency of the organic light-emitting display apparatus 1 may be improved due to a micro-cavity structure.

Also, because the first organic layer 19 completely covers the source electrode 216a or the drain electrode 216b, so that source electrode 216a or the drain electrode 216b is not exposed to the etchant including silver ion, thus, the particle defect due to re-extraction of silver may be prevented.

Because the first interlayer insulating layer 15-1 that is the inorganic layer and the second interlayer insulating layer 15-2 that is the organic layer are formed between the gate electrode 214 and the source and drain electrodes 216a and 216b, instances of cracking in the first interlayer insulating layer 15-1 may be prevented or reduced even when the thickness of the gate electrode 214 and the wiring is great, and parasitic capacitance between wirings below and on the first and second interlayer insulating layers 15-1 and 15-2 may be decreased so that the exact signal transmission may be maintained.

Figure 5:
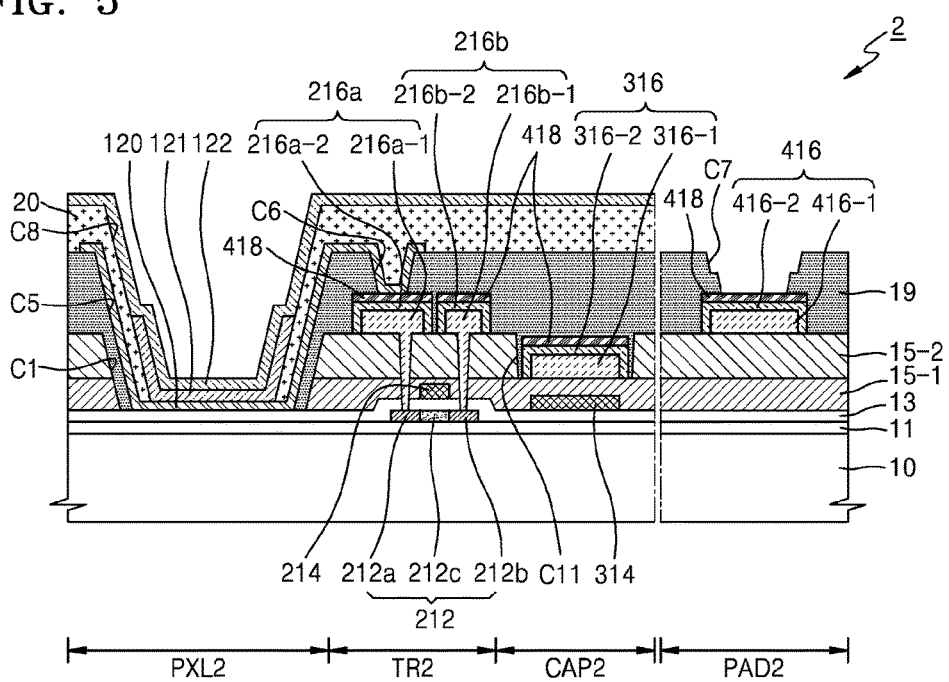
FIG. 5 is a cross-sectional view illustrating a portion of an emission pixel and a portion of a pad of an organic light-emitting display apparatus, according to some embodiments of the present invention.

FIG. 5 is a cross-sectional view illustrating a portion of an emission pixel and a portion of a pad of an organic light-emitting display apparatus 2, according to a second example embodiment.

Referring to FIG. 5, a pixel region PXL2 having at least one emission layer 121, a thin-film transistor region TR2 having at least one thin-film transistor, a capacitor region CAP2 having at least one capacitor, and a pad region PAD2 are arranged on a substrate 10.

Hereinafter, the organic light-emitting display apparatus 2 according to the present embodiment is described with reference to differences from the organic light-emitting display apparatus 1 according to the first embodiment.

In the present embodiment, the pixel region PXL2, the thin-film transistor region TR2, and the pad region PAD2 are same as the first example embodiment, and a structure of the capacitor region CAP2 is different from the first example embodiment.

The capacitor region CAP2 has a capacitor that includes the first electrode 314 arranged on a same layer as the gate electrode 214, and a second electrode 316 arranged on a same layer as a source electrode 216a and a drain electrode 216b.

The first electrode 314 may be formed of a same material as the gate electrode 214. The second electrode 316 may be formed as double metal layers. That is, the second electrode 316 may include a first layer 316-1 and a second layer 316-2.

Only a first interlayer insulating layer 15-1 that is an inorganic layer is arranged as a dielectric layer of the capacitor between the first electrode 314 and the second electrode 316. That is, unlike the first example embodiment, a second interlayer insulating layer 15-2 is not formed. An opening C11 that corresponds to the first electrode 314 of the capacitor is formed in the second interlayer insulating layer 15-2 that is an organic layer, and the second electrode 316 is formed in the opening C11. A bottom surface of the second electrode 316 contacts a top surface of the first interlayer insulating layer 15-1. Thus, compared to the first example embodiment, a thickness of the dielectric layer is decreased so that capacitance in the present embodiment is increased.

A protective layer 418 is formed on the second layer 316-2 of the second electrode 316. The protective layer 418 may prevent the second electrode 316 of the capacitor from being exposed to an etchant while the pixel electrode 120 is etched, so that instances of particle defects may be prevented or reduced.

Because the protective layer 418 and the second layer 316-2 of the second electrode 316 are etched by using a same mask, etched surfaces of ends of the protective layer 418 and the second layer 316-2 of the second electrode 316 may be equal to each other.

Figure 6:
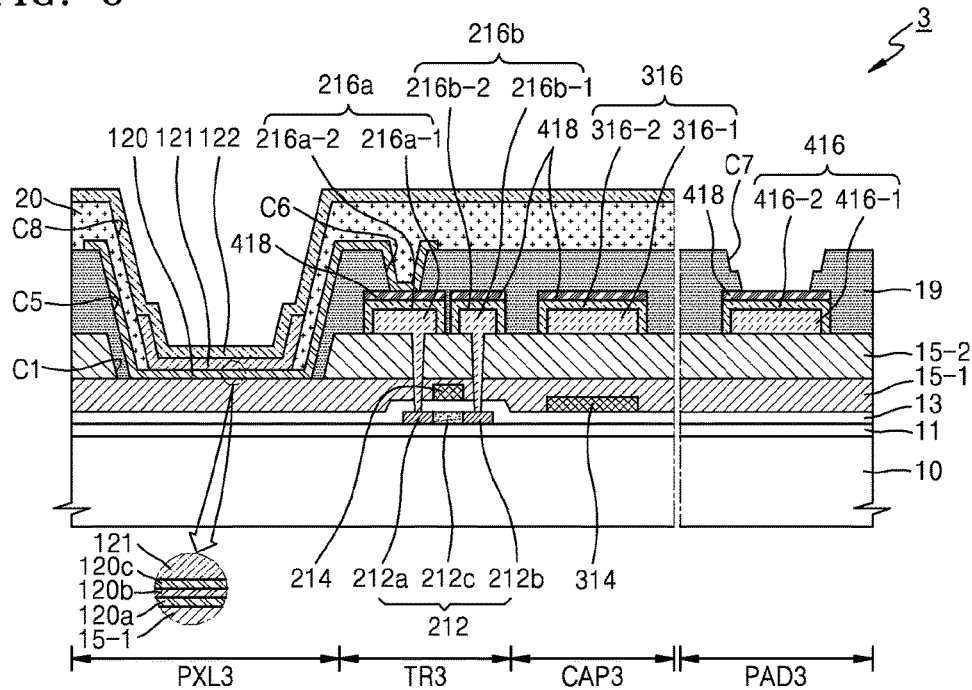
FIG. 6 is a cross-sectional view illustrating a portion of an emission pixel and a portion of a pad of an organic light-emitting display apparatus, according to some embodiments of the present invention.

FIG. 6 is a cross-sectional view illustrating a portion of an emission pixel and a portion of a pad of an organic light-emitting display apparatus 3, according to a third example embodiment.

Referring to FIG. 6, a pixel region PXL3 having at least one emission layer 121, a thin-film transistor region TR3 having at least one thin-film transistor, a capacitor region CAP3 having at least one capacitor, and a pad region PAD3 are arranged on a substrate 10.

Hereinafter, the organic light-emitting display apparatus 3 according to the present embodiment is described with reference to differences from the organic light-emitting display apparatus 1 according to the first embodiment.

In the present embodiment, the thin-film transistor region TR3, the capacitor region CAP3, and the pad region PAD3 are same as the first example embodiment, and a structure of the pixel region PXL3 is different from the first example embodiment.

A pixel electrode 120 is arranged above a buffer layer 11, a gate insulating layer 13, and a first interlayer insulating layer 15-1 in the pixel region PXL3. The pixel electrode 120 is arranged in an opening that is formed in an area that does not overlap with the thin-film transistor and a capacitor to be described later. In the present embodiment, the pixel electrode 120 is formed on the first interlayer insulating layer 15-1 while the pixel electrode 120 directly contacts the first interlayer insulating layer 15-1.

A width of an opening C5 formed in a first organic layer 19 is greater than a width of an opening C8 formed in a second organic layer 20 and is smaller than a width of an opening C1 formed in a second interlayer insulating layer 15-2. The opening C8 formed in the second organic layer 20, the opening C5 formed in the first organic layer 19, and the opening C1 formed in the second interlayer insulating layer 15-2 overlap with each other. An opening is not formed in the first interlayer insulating layer 15-1.

The pixel electrode 120 includes a translucent metal layer 120b. Also, the pixel electrode 120 may further include layers 120a and 120c that include transparent conductive oxide and are respectively formed below and on the translucent metal layer 120b so as to protect the translucent metal layer 120b.

The translucent metal layer 120b may be formed of Ag or a silver alloy. The translucent metal layer 120b and an opposite electrode 122 that is a reflective electrode may form a micro-cavity structure and thus may improve a luminescent efficiency of the organic light-emitting display apparatus 3. Although the micro-cavity structure may cause a color shift, the color shift may be decreased by appropriately adjusting a thickness of the first interlayer insulating layer 15-1 below the pixel electrode 120.

Figure 7:
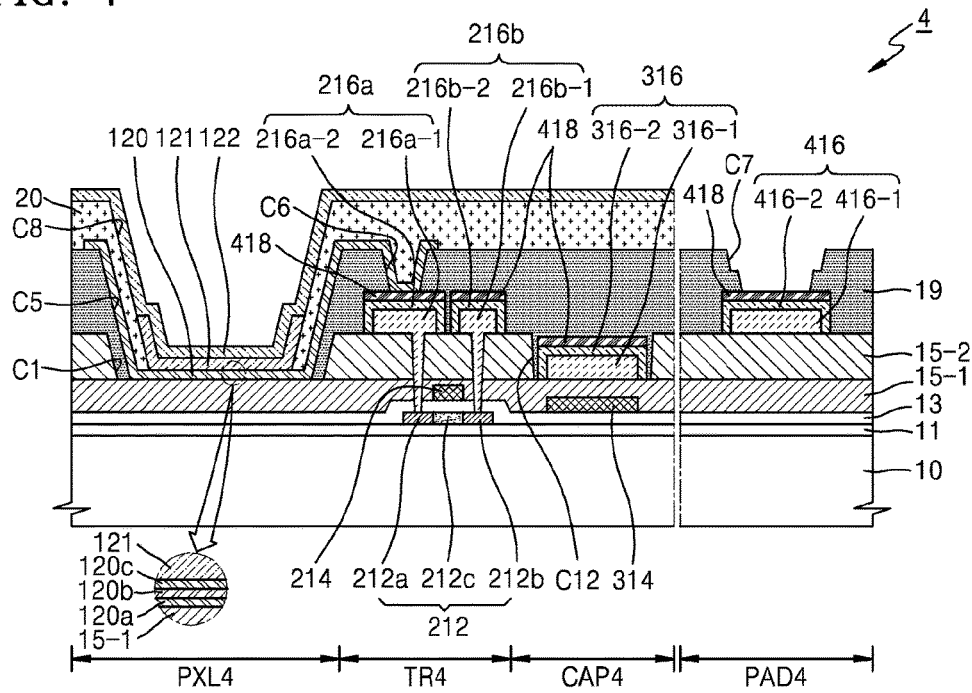
FIG. 7 is a cross-sectional view illustrating a portion of an emission pixel and a portion of a pad of an organic light-emitting display apparatus, according to some embodiments of the present invention.

FIG. 7 is a cross-sectional view illustrating a portion of an emission pixel and a portion of a pad of an organic light-emitting display apparatus 4, according to a fourth example embodiment.

Referring to FIG. 7, a pixel region PXL4 having at least one emission layer 121, a thin-film transistor region TR4 having at least one thin-film transistor, a capacitor region CAP4 having at least one capacitor, and a pad region PAD4 are arranged on a substrate 10.

Hereinafter, the organic light-emitting display apparatus 4 according to the present embodiment is described with reference to differences from the organic light-emitting display apparatus 1 according to the first embodiment.

In the present embodiment, the thin-film transistor region TR4 and the pad region PAD4 are same as the first example embodiment, and structures of the pixel region PXL4 and the capacitor region CAP4 are different from the first example embodiment.

The capacitor region CAP4 has a capacitor including a first electrode 314 arranged on a same layer as a gate electrode 214, and a second electrode 316 arranged on a same layer as a source electrode 216a and a drain electrode 216b.

The first electrode 314 may be formed of a same material as the gate electrode 214. The second electrode 316 may be formed as double metal layers. That is, the second electrode 316 may include a first layer 316-1 and a second layer 316-2.

Only a first interlayer insulating layer 15-1 that is an inorganic layer is arranged as a dielectric layer between the first electrode 314 and the second electrode 316. That is, an opening C12 is formed in a second interlayer insulating layer 15-2 that is an organic layer, and the second electrode 316 is formed in the opening C12. A bottom surface of the second electrode 316 contacts a top surface of the first interlayer insulating layer 15-1. Thus, compared to the first example embodiment, a thickness of the dielectric layer is decreased so that capacitance in the present embodiment is increased.

A protective layer 418 is formed on the second layer 316-2 of the second electrode 316. The protective layer 418 may prevent the second electrode 316 of the capacitor from being exposed to an etchant while a pixel electrode 120 is etched, so that instances of particle defects may be prevented or reduced.

Because the protective layer 418 and the second layer 316-2 of the second electrode 316 are etched by using a same mask, etched surfaces of ends of the protective layer 418 and the second layer 316-2 of the second electrode 316 may be equal to each other.

The pixel electrode 120 is arranged above a buffer layer 11, a gate insulating layer 13, and the first interlayer insulating layer 15-1 in the pixel region PXL4. The pixel electrode 120 is arranged in an opening that is formed in an area that does not overlap with the thin-film transistor and the capacitor to be described later. In the present embodiment, the pixel electrode 120 is formed on the first interlayer insulating layer 15-1 while the pixel electrode 120 directly contacts the first interlayer insulating layer 15-1.

A width of an opening C5 formed in a first organic layer 19 is greater than a width of an opening C8 formed in a second organic layer 20 and is smaller than a width of an opening C1 formed in a second interlayer insulating layer 15-2. The opening C8 formed in the second organic layer 20, the opening C5 formed in the first organic layer 19, and the opening C1 formed in the second interlayer insulating layer 15-2 overlap with each other. An opening is not formed in the first interlayer insulating layer 15-1.

The pixel electrode 120 includes a translucent metal layer 120b. Also, the pixel electrode 120 may further include layers 120a and 120c that include transparent conductive oxide and are respectively formed below and on the translucent metal layer 120b so as to protect the translucent metal layer 120b.

The translucent metal layer 120b may be formed of Ag or a silver alloy. The translucent metal layer 120b and an opposite electrode 122 that is a reflective electrode may form a micro-cavity structure and thus may improve a luminescent efficiency of the organic light-emitting display apparatus 4. Although the micro-cavity structure may cause a color shift, the color shift may be decreased by appropriately adjusting a thickness of the first interlayer insulating layer 15-1 below the pixel electrode 120.

As described above, according to the one or more of the above example embodiments, the organic light-emitting display apparatus has an improved display quality.

It should be understood that the example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. An organic light-emitting display apparatus comprising:
   a substrate;
   a thin-film transistor (TFT) on the substrate and comprising an active layer, a gate electrode, a source electrode, and a drain electrode;

a first interlayer insulating layer between the gate electrode and the source and drain electrodes and comprising an inorganic material;
a second interlayer insulating layer between the first interlayer insulating layer and the source and drain electrodes and comprising an organic material;
a first organic layer covering the source electrode and the drain electrode;
a second organic layer on the first organic layer;
a capacitor comprising a first electrode comprising a same material as the gate electrode, and a second electrode comprising a same material as the source electrode and the drain electrode;
a pixel electrode in an opening in an area that does not overlap with the TFT and the capacitor, and contacting one of the source electrode and the drain electrode;
an emission layer on the pixel electrode; and
an opposite electrode on the emission layer, wherein a portion of the pixel electrode extends between the second organic layer and the one of the source electrode and the drain electrode.

2. The organic light-emitting display apparatus of claim 1, wherein the pixel electrode is a translucent electrode, and the opposite electrode is a reflective electrode.

3. The organic light-emitting display apparatus of claim 2, wherein the pixel electrode comprises a first transparent conductive oxide layer, a translucent metal layer, and a second transparent conductive oxide layer.

4. The organic light-emitting display apparatus of claim 1, wherein the opening in which the pixel electrode is arranged exposes the second interlayer insulating layer, the first organic layer, and the second organic layer in an overlapping manner.

5. The organic light-emitting display apparatus of claim 4, wherein a width of an opening in the first organic layer is greater than a width of an opening in the second organic layer and is smaller than a width of an opening in the second interlayer insulating layer.

6. The organic light-emitting display apparatus of claim 4, wherein the opening in which the pixel electrode is arranged further exposes the first interlayer insulating layer in an overlapping manner.

7. The organic light-emitting display apparatus of claim 6, wherein a width of an opening in the first organic layer is greater than a width of an opening in the second organic layer and is smaller than a width of an opening in the interlayer insulating layer and the second interlayer insulating layer.

8. The organic light-emitting display apparatus of claim 1, wherein a bottom surface of the pixel electrode contacts a top surface of the first interlayer insulating layer.

9. The organic light-emitting display apparatus of claim 1, wherein a thickness of the gate electrode is between about 6,000 and about 12,000 Å.

10. The organic light-emitting display apparatus of claim 1, wherein the second electrode of the capacitor is arranged in an opening in the second interlayer insulating layer.

11. The organic light-emitting display apparatus of claim 10, wherein a bottom surface of the second electrode of the capacitor contacts a top surface of the first interlayer insulating layer.

12. The organic light-emitting display apparatus of claim 1, wherein each of the source electrode and the drain electrode comprises a first metal layer and a second metal layer on the first metal layer.

13. The organic light-emitting display apparatus of claim 1, further comprising a protective layer on the source electrode and the drain electrode.

14. The organic light-emitting display apparatus of claim 1, further comprising a pad electrode on a same layer as the source electrode and the drain electrode.

15. The organic light-emitting display apparatus of claim 14, wherein the pad electrode comprises a first pad layer and a second pad layer on the first pad layer.

16. The organic light-emitting display apparatus of claim 14, further comprising a protective layer on the pad electrode.

17. An organic light-emitting display apparatus comprising:
a substrate;
a thin-film transistor (TFT) on the substrate and comprising an active layer, a gate electrode, a source electrode, and a drain electrode;
a first interlayer insulating layer between the gate electrode and the source and drain electrodes and comprising an inorganic material;
a second interlayer insulating layer between the first interlayer insulating layer and the source and drain electrodes and comprising an organic material;
a first organic layer covering the source electrode and the drain electrode;
a second organic layer on the first organic layer;
a capacitor comprising a first electrode comprising a same material as the gate electrode, and a second electrode comprising a same material as the source electrode and the drain electrode;
a pixel electrode in an opening in an area that does not overlap with the TFT and the capacitor, and contacting one of the source electrode and the drain electrode;
an emission layer on the pixel electrode; and
an opposite electrode on the emission layer, wherein an end of the pixel electrode is on the first organic layer and is covered with the second organic layer.

18. An organic light-emitting display apparatus comprising:
a substrate;
a thin-film transistor (TFT) on the substrate and comprising an active layer, a gate electrode, a source electrode, and a drain electrode;
a first interlayer insulating layer between the gate electrode and the source and drain electrodes and comprising an inorganic material;
a second interlayer insulating layer between the first interlayer insulating layer and the source and drain electrodes and comprising an organic material;
a first organic layer covering the source electrode and the drain electrode;
a second organic layer on the first organic layer;
a capacitor comprising a first electrode comprising a same material as the gate electrode, and a second electrode comprising a same material as the source electrode and the drain electrode;
a pixel electrode in an opening in an area that does not overlap with the TFT and the capacitor, and contacting one of the source electrode and the drain electrode;
an emission layer on the pixel electrode;
an opposite electrode on the emission layer; and
a cathode contact layer on the second interlayer insulating layer and contacting the opposite electrode via contact holes in the first organic layer and the second organic layer.

19. The organic light-emitting display apparatus of claim 18, wherein the cathode contact layer comprises a same material as the source electrode and the drain electrode.

20. The organic light-emitting display apparatus of claim 18, further comprising a protective layer on the cathode contact layer.

* * * * *